US012362259B2

(12) United States Patent
Rehmeyer et al.

(10) Patent No.: US 12,362,259 B2
(45) Date of Patent: Jul. 15, 2025

(54) MANAGEMENT OF HEAT ON A SEMICONDUCTOR DEVICE AND METHODS FOR PRODUCING THE SAME

(71) Applicant: Micron Technology, Inc., Boise, ID (US)

(72) Inventors: James S. Rehmeyer, Boise, ID (US); Christopher G. Wieduwilt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/406,636

(22) Filed: Jan. 8, 2024

(65) Prior Publication Data
US 2024/0145341 A1    May 2, 2024

Related U.S. Application Data

(63) Continuation of application No. 17/030,144, filed on Sep. 23, 2020, now Pat. No. 11,869,826.

(51) Int. Cl.
*H01L 23/467* (2006.01)
*H01L 25/00* (2006.01)
*H01L 25/10* (2006.01)

(52) U.S. Cl.
CPC .......... *H01L 23/467* (2013.01); *H01L 25/105* (2013.01); *H01L 25/50* (2013.01); *H01L 2225/1094* (2013.01)

(58) Field of Classification Search
CPC ..... H01L 23/467; H01L 25/105; H01L 25/50; H01L 25/065; H01L 2225/1094
See application file for complete search history.

(56) References Cited

U.S. PATENT DOCUMENTS

| 6,943,454 B1 | 9/2005 | Gulachenski et al. |
| 2002/0101906 A1 | 8/2002 | Braun et al. |

(Continued)

FOREIGN PATENT DOCUMENTS

| CN | 1893073 A | 1/2007 |
| CN | 101661931 A | 3/2010 |

(Continued)

OTHER PUBLICATIONS

Koyle, Neal: "Micon DDR5: Key Module Features". https://media-www.micron.com/-/media/client/global/documents/products/technical-marketing-brief/ddr5_key_module_features_tech_brief.pdf?la=en&rev=f3ca96bed7d9427ba72b4c192dfacb56 (Year: 2020).

(Continued)

*Primary Examiner* — Marlon T Fletcher
*Assistant Examiner* — Christina A Sylvia
(74) *Attorney, Agent, or Firm* — Dorsey & Whitney LLP

(57) ABSTRACT

An improved memory module and methods for constructing the same are disclosed herein. The memory module includes a substrate having a first surface and a second surface opposite the first surface, each having a central portion, a first array area and a second array area. The first array area is cooler than the second array area during operation. The memory module also includes a power management integrated circuit attached to the central portion of the first surface. The memory module also includes a first semiconductor die attached to the substrate in the first array area. The first semiconductor die has a first performance rating of an operating parameter at high temperatures. The memory module also includes a second semiconductor die attached to the substrate in the second array area. The second semiconductor die has a second performance rating of an operating parameter better than the first performance rating at high temperatures.

20 Claims, 9 Drawing Sheets

(56) References Cited

U.S. PATENT DOCUMENTS

| | | |
|---|---|---|
| 2007/0004055 A1 | 1/2007 | Ball et al. |
| 2007/0290333 A1 | 12/2007 | Saini et al. |
| 2010/0020583 A1 | 1/2010 | Kang et al. |
| 2010/0044861 A1 | 2/2010 | Chiu et al. |
| 2010/0244136 A1 | 9/2010 | Takafuji et al. |
| 2011/0075451 A1 | 3/2011 | Bayerer et al. |
| 2011/0272737 A1 | 11/2011 | Tanaka et al. |
| 2017/0033190 A1 | 2/2017 | Xie et al. |
| 2020/0027500 A1* | 1/2020 | Heymann .............. G01K 13/00 |
| 2020/0117396 A1 | 4/2020 | Lim et al. |
| 2020/0279588 A1 | 9/2020 | Lym et al. |
| 2022/0093488 A1 | 3/2022 | Rehmeyer et al. |

FOREIGN PATENT DOCUMENTS

| | | |
|---|---|---|
| CN | 101855704 A | 10/2010 |
| CN | 106409789 A | 2/2017 |
| CN | 110233173 A | 9/2019 |
| DE | 10103991 C1 | 6/2002 |
| JP | 2010192671 A | 9/2010 |

OTHER PUBLICATIONS

TW Patent Application No. 110132549—Taiwanese Office Action, dated Aug. 26, 2022, with English Translation, 25 pages.
TW Patent Application No. 110132549—Taiwanese Search Report, dated May 16, 2022, with English Translation, 3 pages.
CN Patent Application No. 202111054333.9—Chinese Office Action and Search Report, dated Mar. 20, 2025, with English Translation, 21 pages.

* cited by examiner

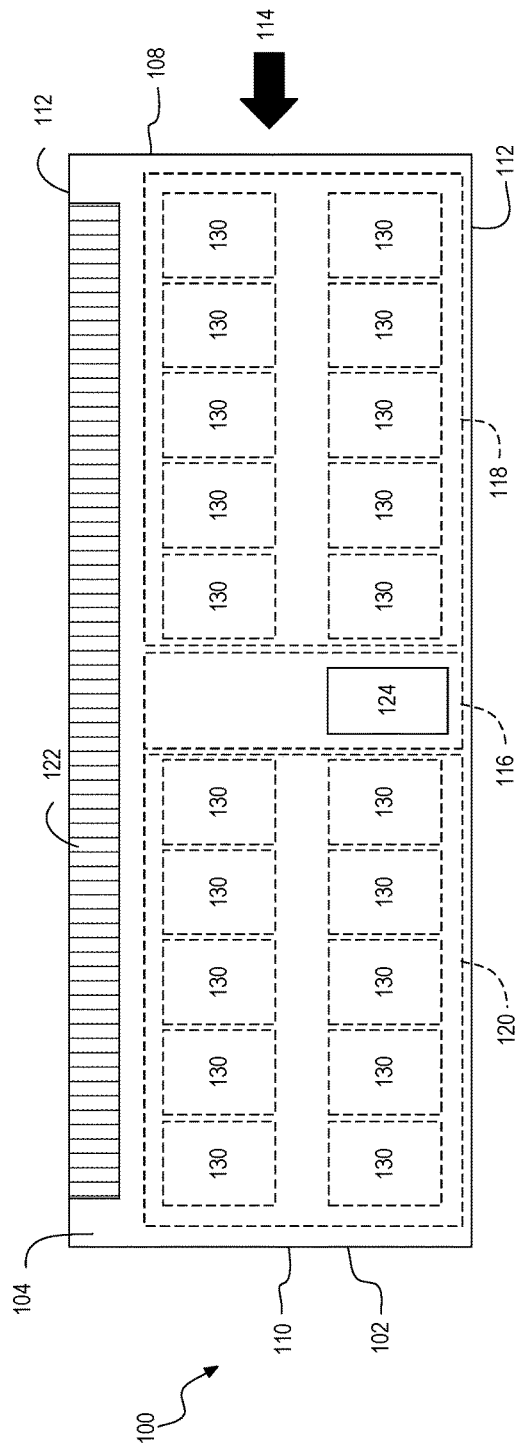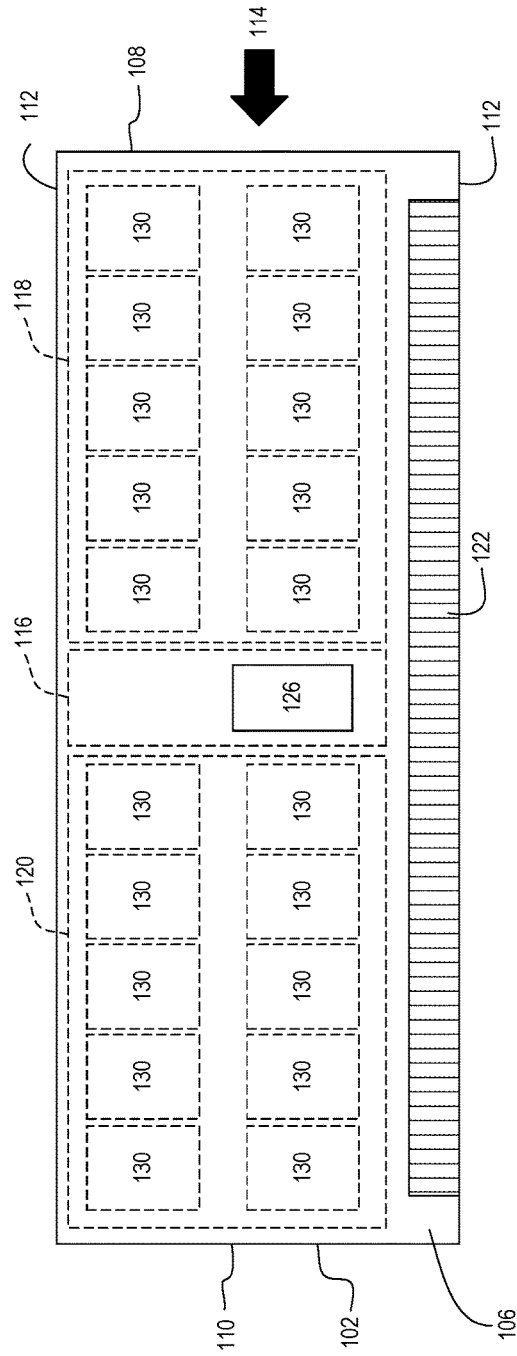
FIG. 2A
FIG. 2B

MANAGEMENT OF HEAT ON A SEMICONDUCTOR DEVICE AND METHODS FOR PRODUCING THE SAME

CROSS-REFERENCE TO RELATED APPLICATION(S)

This application is a continuation of U.S. patent application Ser. No. 17/030,144, filed Sep. 23, 2020, which is incorporated herein by reference in its entirety.

TECHNICAL FIELD

The present disclosure generally relates to semiconductor devices. In particular, the present technology generally relates to improved management of heat on a memory module.

BACKGROUND

Semiconductor devices, such as double data rate random access memory ("DDR RAM") dual in-line memory modules, die stack assemblies, NAND-type flash memory devices, etc., typically include a plurality of semiconductor dies along with one or more heat generating components. As semiconductor device footprints shrink and processing speeds increase, the operating temperature of semiconductor devices typically increases, which can impair the performance of the semiconductor dies.

For example, a DIMM typically includes several semiconductor dies, such as dynamic random-access memory integrated circuits, mounted on one or more surfaces of a DIMM substrate (e.g., a printed circuit board). In a typical fourth generation double data rate ("DDR4") configuration of a DIMM, the DIMM includes a substrate, several semiconductor dies mounted on both sides of the substrate, a register clock driver ("RCD"), and several connectors. In newer generations, (e.g., DDR5 DIMMs), the DIMM also includes a power management integrated circuit ("PMIC") mounted to the substrate. The PMIC produces additional heat and the RCD operates at shorter clock cycles, which has led to increases in the operating temperatures of DDR5 DIMM devices. Additionally, the semiconductor dies are mounted closer together to make room for the PMIC, increase the capacity of newer generations, and account for the smaller DIMM pitch of the newer generations. In turn, the higher temperatures have led to increased power consumption from the semiconductor dies as well as more frequent die failure.

BRIEF DESCRIPTION OF THE DRAWINGS

Many aspects of the present technology can be better understood with reference to the following drawings. The components in the drawings are not necessarily drawn to scale. Instead, emphasis is placed on clearly illustrating the principles of the present technology.

FIG. 2A is a top plan view of a DIMM before any semiconductor dies are mounted to the substrate in accordance with some embodiments of the present technology.

FIG. 2B is a bottom plan view of the DIMM of FIG. 2A before any semiconductor dies are mounted to the substrate in accordance with some embodiments of the present technology.

DETAILED DESCRIPTION

Figure 1A:
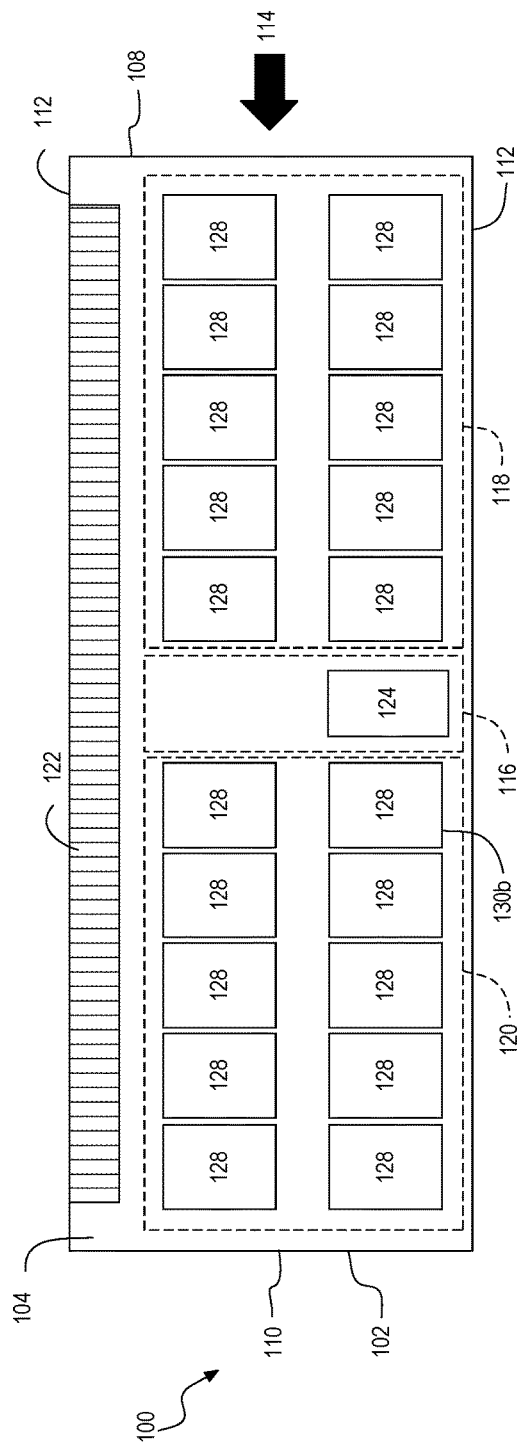
FIG. 1A is a top plan view of a dual in-line memory module ("DIMM") in accordance with some embodiments of the present technology.

An improved construction of a semiconductor device and methods for manufacturing the same are disclosed herein. In some embodiments, the semiconductor device is a dual in-line memory module (DIMM). The DIMM includes a DIMM substrate (e.g., a printed circuit board) having a first surface and a second surface opposite the first surface. Each of the first and second surfaces have a central portion, a first array area on one side of the central portion, and a second array area on an opposite side of the central portion. In some embodiments, the first array area is cooler than the second array area during operation of the DIMM (e.g., when the first array area is upstream from the central portion relative to a direction of airflow across the DIMM). A power management integrated circuit ("PMIC") can be attached to the central portion of the first surface. A first semiconductor die can be attached to the substrate in the first array area such that the first semiconductor die is located upstream of the PMIC. A second semiconductor die can be attached to the substrate in the second array area such that the second semiconductor die is located downstream of the PMIC. The semiconductor dies each have a performance rating of an operating parameter indicating how effectively the semiconductor die operates at higher temperatures (e.g., how much the operating parameter of the semiconductor die changes at higher temperatures, a raw score for the operating parameter at higher temperatures, etc.). In various embodiments, the operating parameter can be power consumption, data retention, and/or some combination therein. The second semiconductor die can have a better performance rating than the first semiconductor die, and accordingly be more suited to operate at higher temperatures.

As disclosed herein, the present technology also includes a method for constructing the improved DIMM. The method can include determining a performance rating of an operating parameter affected by temperature for individual semiconductor dies of the DIMM at a first temperature; then determining the performance rating of the operating parameter of the semiconductor dies at a second temperature higher than the first temperature. After determining the performance ratings, the method can include identifying at least one first semiconductor die and at least one second semiconductor die, where the second semiconductor die is less temperature-affected than the first semiconductor die based on the determined performance ratings. Once these have been identified, the method can include constructing a DIMM to account for the performance ratings. For example, the method includes mounting one or more heat generating components to a central portion of a DIMM substrate, mounting the first semiconductor die at a first array area of the DIMM substrate, and mounting the second semiconductor die at a second array area of the DIMM substrate. The first array area can be chosen for the first semiconductor die because the first array area is cooler than the second array area during operation of the DIMM. For example, the first array area can be upstream from the one or more heat generating components relative to a direction of airflow across the DIMM such that heat from the PMIC is directed away from the first array area.

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As used herein, the terms "upstream," "downstream," "upper," "lower," "distal," "proximal," "front," and "back" can refer to relative directions or positions of features in the semiconductor devices in view of the orientation shown in the Figures. For example, "distal" or "distal-most" can refer to a feature positioned farther from the heat producing components of the semiconductor device than other features. These terms, however, should be construed broadly to include semiconductor devices having other orientations, such as inverted or inclined orientations where top/bottom, over/under, above/below, up/down, front/back and left/right can be interchanged depending on the orientation.

Further, as used herein, the term "semiconductor die" can include a semiconductor die package and/or a semiconductor die assembly (e.g., one or more semiconductor dies attached to a package substrate and/or encapsulated by a protective coating). Accordingly, the term "semiconductor die" should not be construed to exclude a semiconductor package or assembly except where explicitly indicated.

Figure 1B:
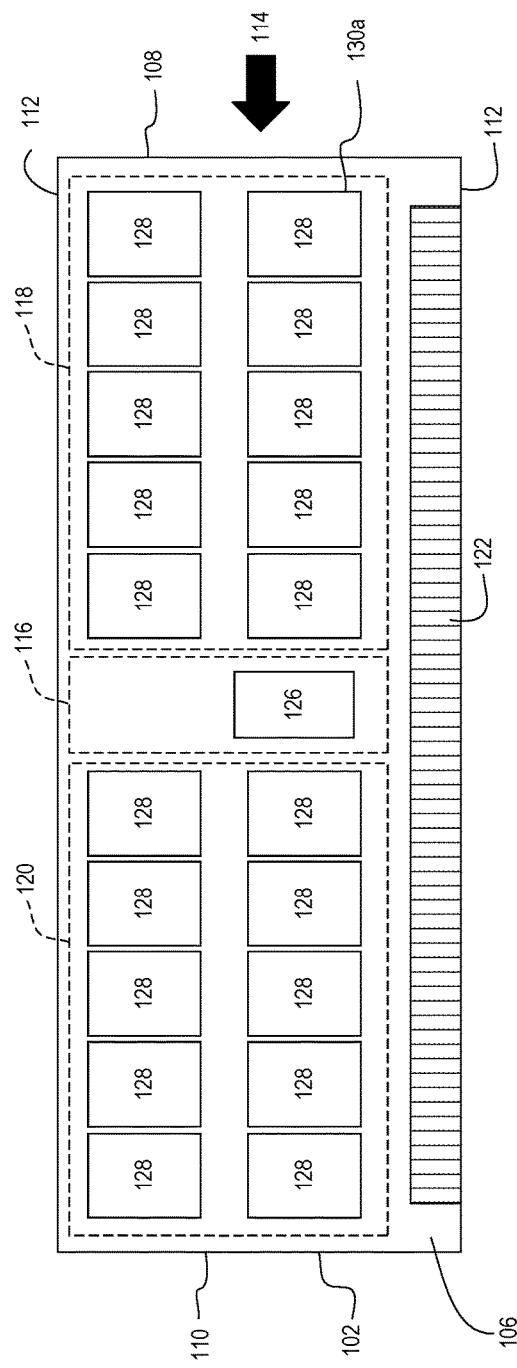
FIG. 1B is a bottom plan view of the DIMM of FIG. 1A in accordance with some embodiments of the present technology.

FIG. 1A is a top plan view, and FIG. 1B is a bottom plan view, illustrating a dual in-line memory module 100 ("DIMM 100") in accordance with some embodiments of the present technology. In the illustrated embodiment, the DIMM 100 includes a DIMM substrate 102 with a first surface 104 (e.g., a top surface) illustrated in FIG. 1A and a second surface 106 opposite the first surface 104 (e.g., a bottom surface) illustrated in FIG. 1B. The DIMM substrate 102 also has a first edge 108, a second edge 110 opposite the first edge 108, and longitudinal edges 112 extending from the first edge 108 to the second edge 110. The first edge 108 can be located "upstream" from the second edge 110 with respect to an airflow 114 traveling across the first and second surfaces 104, 106 generally parallel with the longitudinal edges 112.

As further illustrated, the first and second surfaces 104, 106 of the DIMM substrate 102 include a central portion 116, a first array area 118, and a second array area 120. The first array area 118 is on a first side of the central portion 116 and between the central portion 116 and the first edge 108. The second array area 120 is on a second side of the central portion 116 opposite the first side and between the central portion 116 and the second edge 110. Accordingly, the first array area 118 is upstream from the central portion 116 with respect to the airflow direction 114, while the second array area 120 is downstream.

In some embodiments, the DIMM 100 can include several connectors 122 along one of the longitudinal edges 112. The connectors 122 can allow the DIMM 100 to be connected to other components in a semiconductor system.

With reference to FIG. 1A, the DIMM 100 also includes a power management integrated circuit 124 ("PMIC 124") attached to the central portion 116 of the first surface 104 of the DIMM substrate 102 and semiconductor dies 128 attached to the first surface 104 in both the first array area 118 and the second array area 120. In the illustrated embodiment, the DIMM 100 includes ten semiconductor dies 128 in two rows in the first array area 118, as well as ten semiconductor dies 128 in two rows in the second array area 120. In various other embodiments, the DIMM 100 can include other numbers of semiconductor dies 128 that can be attached to the first surface 104 in the first array area 118 and in the second array area 120 and/or arranged in various other patterns. For example, in some embodiments, the DIMM 100 can include twenty semiconductor dies in the first array area 118 and arranged in four rows, and fifteen semiconductor dies in the second array area 120 and arranged in three rows.

With reference to FIG. 1B, the DIMM 100 also includes a register clock driver 126 ("RCD 126") attached to the central portion 116 of the second surface 106 of the DIMM substrate 102 and semiconductor dies 128 attached to the second surface 106 in both the first array area 118 and the second array area 120. Further, although illustrated embodiment has ten semiconductor dies 128 attached to each of the first array area 118 and second array area 120 of the second surface 106, the DIMM 100 can include any other number of semiconductor dies 128 in various other arrangements.

In some embodiments, all of the active semiconductor elements are attached and mounted to only one surface of the DIMM 100. For example, in some embodiments, the PMIC 124 and/or the RCD 126 are attached to the central portion 116 of the first surface 104 while all of the semiconductor dies 128 are mounted on the first surface 104.

In the illustrated embodiment, the PMIC 124 and the RCD 126 are significant sources of heat in DDR5 DIMMs. Additionally, the semiconductor dies 128 are packed into a smaller footprint. As a result, the operating temperature of the DIMM 100 is often high enough to affect a performance rating of one or more operating parameters of the semiconductor dies 128. For example, the operating parameters affected by temperature can include power consumption, calculation speed, data retention, and/or combinations therein. For example, semiconductor dies 128 with high cell data retention failure rates, IDD2N, or IDD3N have been found to consume more power at higher temperatures. Accordingly, controlling for the operating temperature of the DIMM 100 can improve the performance and retention of the semiconductor dies 128. However, temperature control mechanisms in addition to the airflow 114 consume space and power, undermining the downsizing of a DDR5 DIMM as well as the power consumption improvements.

Instead, the semiconductor dies 128 can be arranged with the effects of the operating temperature in mind. For example, the airflow 114 transfers heat such that portions of the DIMM 100 downstream from the PMIC 124 and RCD 126 can have a higher temperature than portions that are upstream. For example, in the illustrated embodiment, the first array areas 118 of the first and second surfaces 104, 106 can have a lower average temperature than the second array areas 120 of the first and second surfaces 104, 106. Further, because the PMIC 124 typically emits more heat than the RCD 126, the first array area 118 of the second surface 106 can have a lower average temperature than the first array area 118 of the first surface 104. Accordingly, the overall performance of the illustrated DIMM 100 can be improved by mounting semiconductor dies that are relatively more temperature-affected in the first array area 118, and semiconductor dies that are relatively less temperature-affected in the second array area 120.

In some embodiments, the largest temperature difference in the illustrated DIMM 100 can be between a first die attach location 130a (FIG. 1B) in the first array area 118 on the second surface 106 (e.g., the coolest die attach location) and a second die attach location 130b (FIG. 1A) in the second array area 120 on the first surface 104 (e.g., the hottest die attach location). In some embodiments, the temperature difference from the hottest die attach location to the coolest die attach location can be about 40° C. Accordingly, the overall performance of the illustrated DIMM 100 can be further improved by mounting a semiconductor die that is relatively more temperature-affected in the first die attach location 130a, and a semiconductor die that is relatively less temperature-affected in the second die attach location 130b. In some embodiments, the most-temperature affected die can be mounted in the first die attach location 130a and/or the least temperature affected die can be mounted in the second die attach location 130b.

In some embodiments, the improvements described above can be generalized and captured by a method of construction that includes determining a performance rating of one or more operating parameters for each individual semiconductor die 128 to be included in the DIMM 100 at a first temperature. In some embodiments, the first temperature can be generally equal to the coolest operating zone of the DIMM 100 (e.g., the operating temperature at the coldest die attach location 130a).

The method continues by determining a performance rating of the one or more operating parameters for each individual semiconductor die 128 of the DIMM 100 at a second temperature higher than the first temperature. In some embodiments, the second temperature can be generally equal to the hottest operating zone of the DIMM 100 (e.g., the operating temperature at the hottest die attach location 130b).

The method continues by identifying at least one first semiconductor die that is relatively more temperature affected than other semiconductor dies and at least one second semiconductor die that is relatively less temperature-affected than the other semiconductor dies. How temperature-affected a semiconductor die is can be based on the determined performance rating of the one or more operating parameters at the first and second temperatures. In some embodiments, the third step can include identifying one or more most temperature-affected semiconductor dies as the first semiconductor dies, and/or one or more least temperature-affected semiconductor dies as the second semiconductor dies. In some embodiments, the third step can include identifying a predetermined proportion of the semiconductor dies (e.g., about 1%, 5%, 10%, 20%, or other suitable portions) as more temperature-affected than the other semiconductor dies, and/or a predetermined portion as less temperature-affected than the other semiconductor dies.

The method further includes mounting components of the DIMM 100 to the DIMM substrate 102. For example, the PMIC 124 can be mounted to a central portion 116 of the first surface 104 the DIMM substrate 102 and the RCD 126 can be mounted to the central portion 116 of the second surface 106 of the DIMM substrate 102 opposite the first surface 104. The PMIC 124 and the RCD 126 are mounted to the central portion 116 to balance timing among the semiconductor dies 128 in the DIMM 100. For example, semiconductor dies 128 that are generally equidistant from the central portion 116 in either the upstream or downstream direction will receive signals from the RCD 126 at generally equal times. Accordingly, mounting the PMIC 124 and RCD 126 in the central portion 116 allows the timing among the semiconductor dies 128 to be easily balanced. Further, the at least one first semiconductor die can be mounted to a first array area 118, and the at least one second semiconductor die can be mounted to a second array area 120.

In various embodiments, the method can include various additional processes that further improve the performance of the DIMM 100. For example, in some embodiments, the method can include identifying one or more first die attach locations 130a on the DIMM substrate 102 (e.g., the die attach locations having the cooler operating temperature) and mounting the first semiconductor dies in the first die attach locations 130a. In some embodiments, if there are N number of first semiconductor dies, the method can include identifying N number of cooler die attach locations. Similarly, in some embodiments, the method can include identifying one or more second die attach locations 130b on the DIMM substrate 102 (e.g., the die attach locations having the hottest operating temperature) and mounting the second semiconductor dies in the hotter die attach locations. In some embodiments, if there are N number of second semiconductor dies, the method can include identifying N number of hotter die attach locations.

In some embodiments, the method can include identifying at least one third semiconductor die that is less temperature-affected than the first semiconductor die and more temperature-affected than the second semiconductor die. In some embodiments, the at least one third semiconductor die can be the second-most temperature-affected die and can be mounted in the first array area 118 of the DIMM substrate 102, and/or in the second coolest die attach location(s) on the DIMM substrate 102 (see FIGS. 5A and 5B). In some embodiments, the method can include identifying at least one fourth semiconductor die that is less temperature-affected than the third semiconductor die and more temperature-affected than the second semiconductor die. In some embodiments, the at least one fourth semiconductor die can be the second-least temperature-affected die and can be mounted in the second array area 120 of the DIMM substrate 102, and/or in the second hottest die attach location(s) on the DIMM substrate 102 (see FIGS. 6A and 6B).

FIGS. 2A-7B illustrate stages of constructing the DIMM 100 in accordance with embodiments of the method discussed above. FIG. 2A is a top plan view, and FIG. 2B is a bottom plan view, illustrating the DIMM 100 before any semiconductor dies 128 are mounted to the DIMM substrate 102 in accordance with some embodiments of the present technology. In the illustrated embodiment, the DIMM 100 includes the DIMM substrate 102, the PMIC 124 attached to the central portion 116 of the first surface 104 of the DIMM substrate 102, and the RCD 126 attached to the central portion 116 of the second surface 106 of the DIMM substrate 102. As further illustrated, the first array area 118 includes several die attach locations 130 on the first surface 104, as well as several die attach locations 130 on the second surface 106. Similarly, the second array area 120 includes several die attach locations 130 on the first surface 104 as well as several die attach locations 130 on the second surface 106.

Because the PMIC 124 is attached to the central portion 116 of the first surface 104, the first surface 104 tends to have warmer die attach locations 130 than the second surface 106. Further, because the airflow travels across the DIMM 100 from the first edge 108 to the second edge 110, the first array area 118 (upstream from the PMIC 124) tends to have cooler die attach locations 130 than the second array area 120 (downstream from the heat generating components). As a result, the coolest die attach location 130 on the DIMM substrate 102 tends to be the location of the first array area 118 farthest from the central portion 116 on the second surface 106, while the second coolest die attach location tends to be the location of the first array area 118 farthest from the central portion 116 on the first surface 104. Conversely, the hottest die attach locations 130 tend to be the locations of the second array area 120 closest to the central portion 116.

Figure 3A:
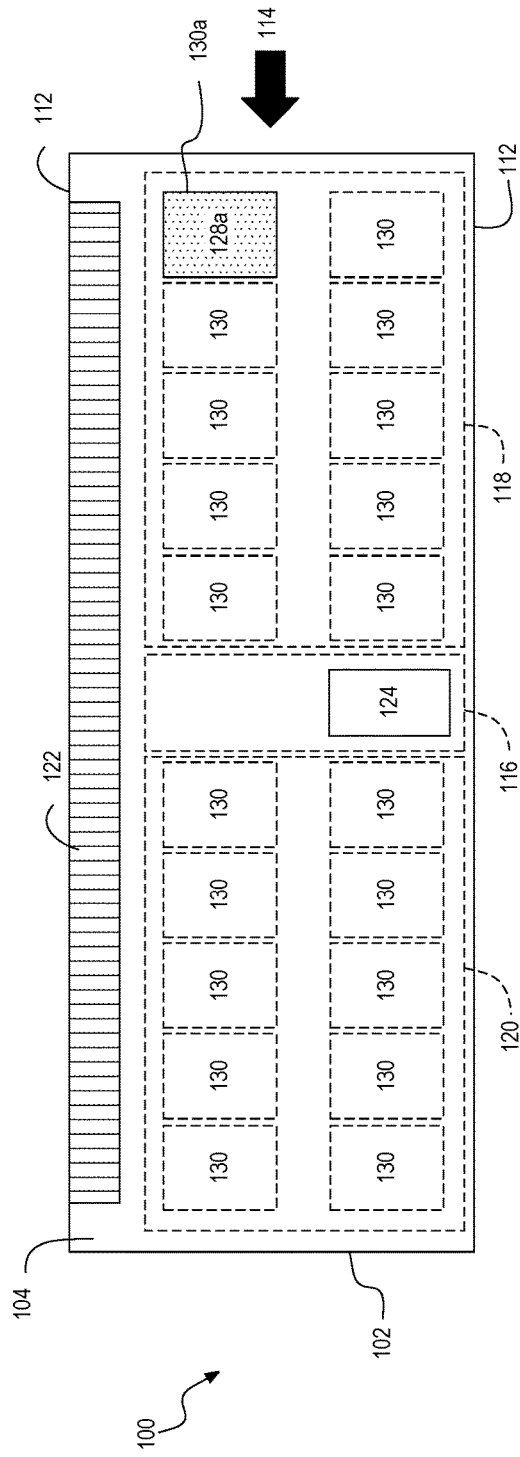
FIG. 3A is a top plan view of the DIMM of FIG. 2A after two first semiconductor dies are mounted to the substrate in accordance with some embodiments of the present technology.
Figure 3B:
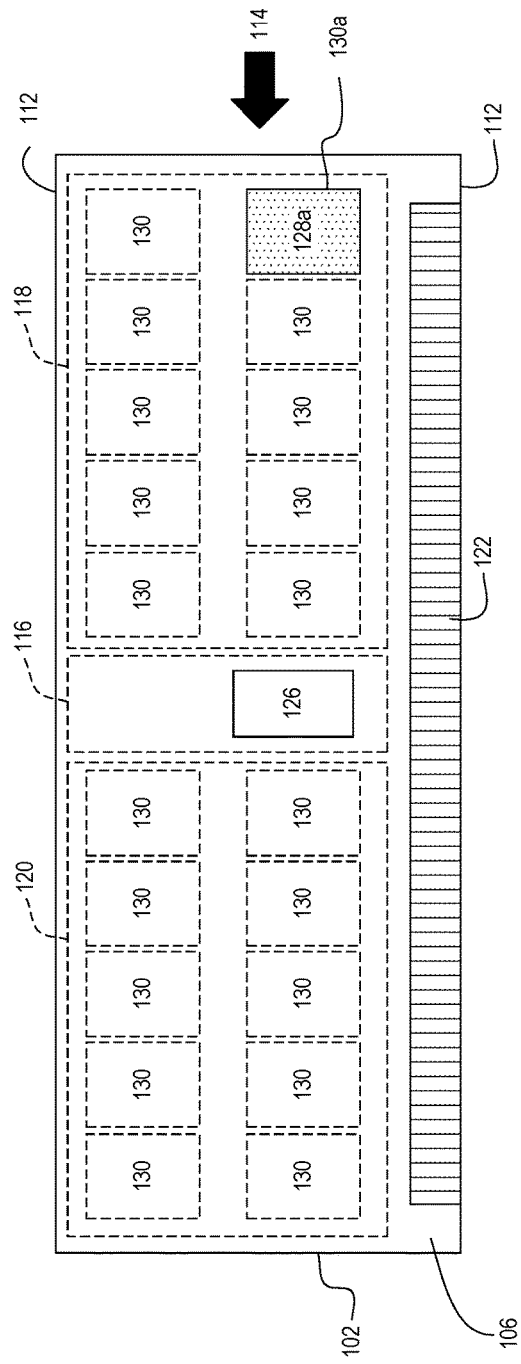
FIG. 3B is a bottom plan view of the DIMM of FIG. 3A after two first semiconductor dies are mounted to the substrate in accordance with some embodiments of the present technology.

FIG. 3A is a top plan view, and FIG. 3B is a bottom plan view, illustrating the DIMM 100 after two first semiconductor dies 128*a* are mounted to the DIMM substrate 102 in accordance with some embodiments of the present technology. In the illustrated embodiment, the first semiconductor dies 128*a* have been mounted to the DIMM substrate 102 in two first die attach locations 130*a* distal-most to the PMIC 124 in the first array area 118 (e.g., adjacent the first edge 108 and upstream from the central portion 116). Accordingly, in some embodiments, the first semiconductor dies 128*a* are mounted in the coolest die attach locations on the DIMM substrate 102.

As discussed above, the first semiconductor dies 128*a* can be more affected by temperature than other semiconductor dies in the DIMM 100 (e.g., can have a larger decline in a performance rating of one or more operating parameters between the low temperatures and the high temperatures, can have a worse performance rating at high temperatures, etc.). Accordingly, the placement of the first semiconductor dies 128*a* in the first array area 118 can improve the overall functionality of the DIMM 100 by partially avoiding the deleterious effects of higher temperatures on the operating parameter of the first semiconductor dies 128*a*. In the illustrated embodiment, the placement of the first semiconductor dies 128*a* in the first die attach locations 130*a* (e.g., located in the coolest locations on the DIMM) can further improve the overall functionality of the DIMM 100 by further avoiding the deleterious effects of higher temperatures. In some embodiments, the first semiconductor dies 128*a* can be the most temperature-affected (e.g., have operating parameters that are all worse, or worse on average, than the other semiconductor dies). Accordingly, in these embodiments, the placement of the first semiconductor dies 128*a* in the first die attach locations 130*a* can also further improve the overall functionality of the DIMM 100 by further avoiding the deleterious effects of higher temperatures.

Although the DIMM 100 is illustrated as having two first semiconductor dies 128*a*, the DIMM 100 can include other numbers of first semiconductor dies 128*a* (therefore occupying a different number of first die attach locations 130*a*). For example, in some embodiments, the DIMM 100 includes only a single first semiconductor die 128*a*, which can be mounted to a single first die attach location 130*a* (e.g., the coolest die attach location and typically the distal-most location upstream from the PMIC 124 in the first array area 118 on the second surface 106). In other embodiments, the DIMM 100 can include four first semiconductor dies 128*a* mounted to the four first die attach locations 130*a*, such as all four distal-most locations from the PMIC 124 in the first array area 118.

Figure 4A:
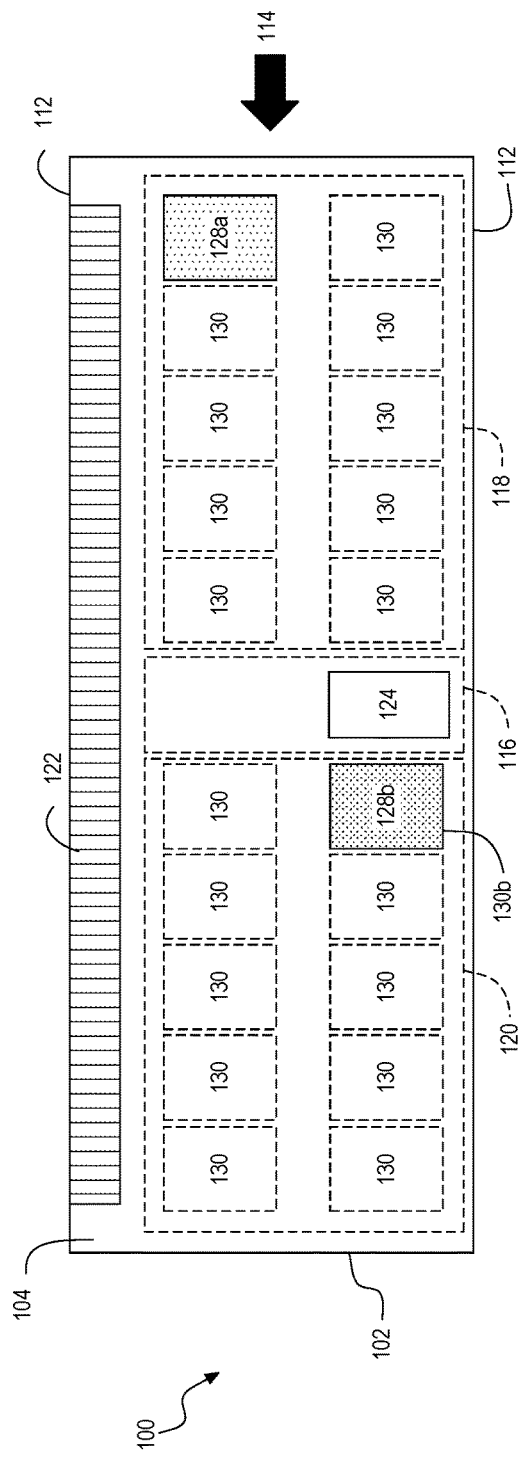
FIG. 4A is a top plan view of the DIMM of FIG. 3A after two second semiconductor dies are mounted to the substrate in accordance with some embodiments of the present technology.
Figure 4B:
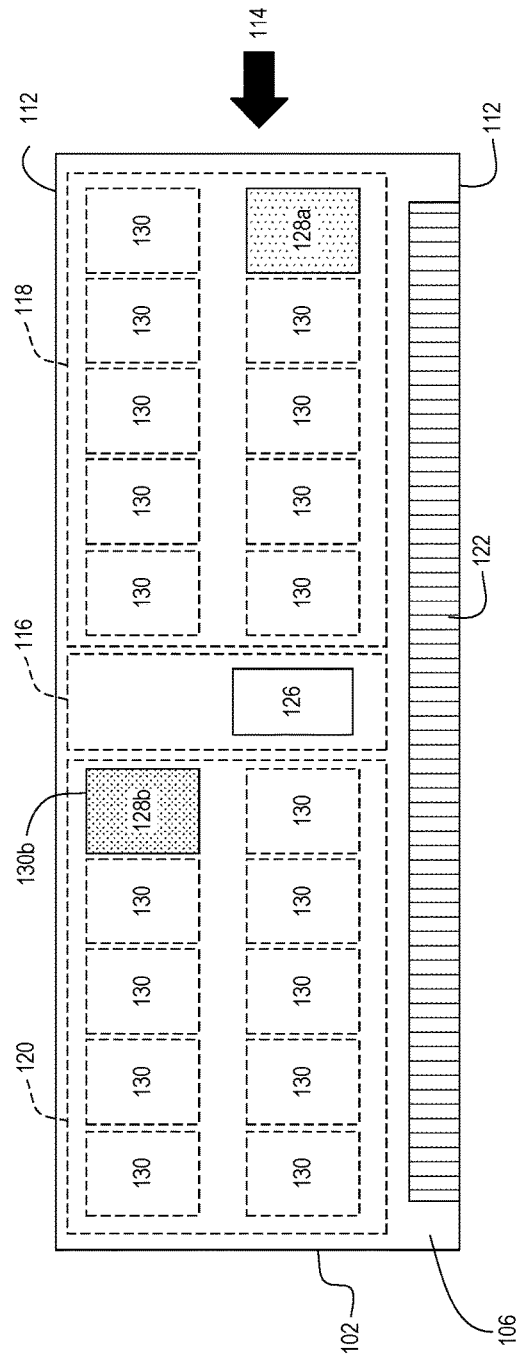
FIG. 4B is a bottom plan view of the DIMM of FIG. 3A after two second semiconductor dies are mounted to the substrate in accordance with some embodiments of the present technology.

FIG. 4A is a top plan view, and FIG. 4B is a bottom plan view, illustrating the DIMM 100 after two second semiconductor dies 128*b* are mounted to the DIMM substrate 102 in accordance with some embodiments of the present technology. In the illustrated embodiment, the second semiconductor dies 128*b* have been mounted to the DIMM substrate 102 in two second die attach locations 130*b* proximal-most to the PMIC 124 in the second array area 120 (e.g., downstream from the central portion 116). Accordingly, in some embodiments, the second semiconductor dies 128*b* are mounted in the hottest die attach locations on the DIMM substrate 102.

As discussed above, the second semiconductor dies 128*b* can have one or more operating parameters that are less affected by temperature than other semiconductor dies in the DIMM 100. Accordingly, the placement of the second semiconductor dies 128*b* in the second array area 120 can improve the overall functionality of the DIMM 100 by partially reducing the deleterious effects of higher temperatures (e.g., by locating less temperature-affected semiconductor dies in hotter die attach locations). In the illustrated embodiment, the placement of the second semiconductor dies 128*b* in the second die attach locations 130*b* can further improve the overall functionality of the DIMM 100 by further reducing the deleterious effects of the higher temperatures. In some embodiments, the second semiconductor dies 128*b* can be the least temperature-affected (e.g., have operating parameters that are all better, or better on average, than all other semiconductor dies in the DIMM 100). Accordingly, in these embodiments, the placement of the second semiconductor dies 128*b* in the second die attach locations 130*b* can also further improve the overall functionality of the DIMM 100 by further reducing the deleterious effects of the higher temperatures.

In some embodiments, the second semiconductor dies 128b can have an operating parameter that is improved at higher temperatures. For example, in some embodiments, the processing speed of the second semiconductor dies 128b can improve at higher temperatures. Accordingly, in these embodiments, the placement of the second semiconductor dies 128b in the second die attach locations 130b can improve the overall functionality of the DIMM 100 by taking advantage of the higher temperatures. In some embodiments, the second semiconductor dies 128b can be the most-improved semiconductor die at higher temperatures. Accordingly, in these embodiments, the placement of the second semiconductor dies 128b in the second die attach locations 130b can further improve the overall functionality of the DIMM 100.

Although the DIMM 100 is illustrated as having two second semiconductor dies 128b, the DIMM 100 can include other numbers of second semiconductor dies 128b (therefore occupying a different number of second die attach locations 130b). For example, in some embodiments, the DIMM 100 includes only a single second semiconductor die 128b, which can be mounted to a single second die attach location 130b (e.g., the hottest die attach location, typically the location proximal-most to the PMIC 124 in the second array area 120 on the first surface 104). In other embodiments, the DIMM 100 can include four second semiconductor dies 128b mounted to four second die attach locations 130b, such as all four locations proximal-most to the PMIC 124 in the second array area 120.

Figure 5A:
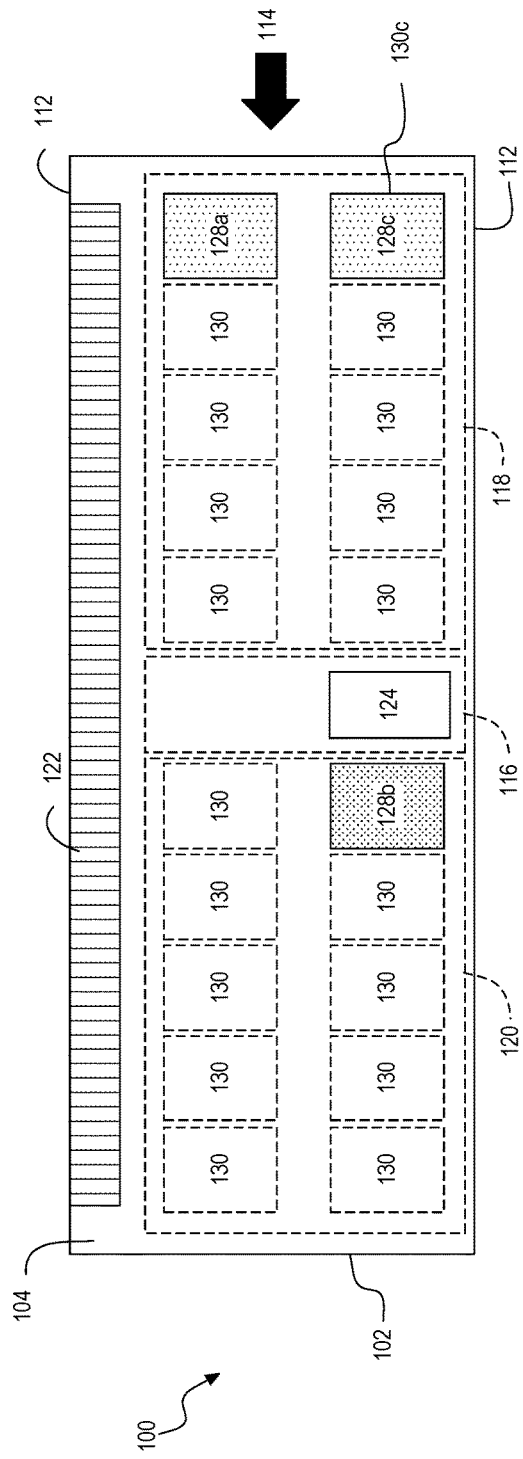
FIG. 5A is a top plan view of the DIMM of FIG. 4A after two third semiconductor dies are mounted to the substrate in accordance with some embodiments of the present technology.
Figure 5B:
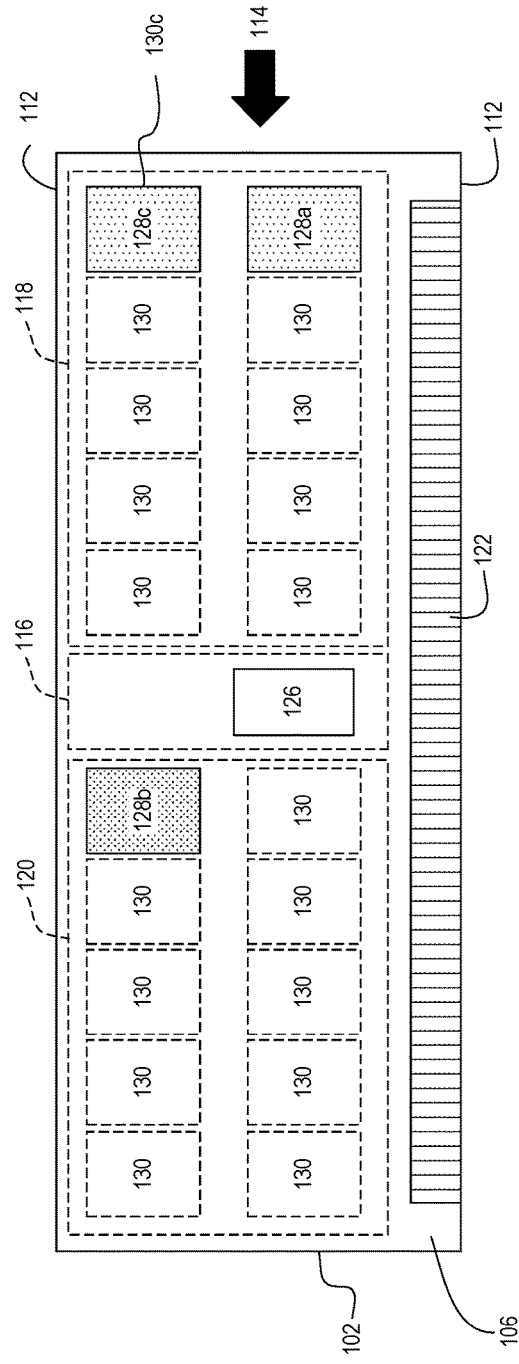
FIG. 5B is a bottom plan view of the DIMM of FIG. 4A after two third semiconductor dies are mounted to the substrate in accordance with some embodiments of the present technology.

FIG. 5A is a top plan view, and FIG. 5B is a bottom plan view, illustrating the DIMM 100 after two third semiconductor dies 128c are mounted to the DIMM substrate 102 in accordance with some embodiments of the present technology. In the illustrated embodiment, the third semiconductor dies 128c have been mounted to the DIMM substrate 102 in two die third attach locations 130c that are next distal-most to the PMIC 124 in the first array area 118 after the first semiconductor dies 128a have been mounted. Accordingly, in some embodiments, the third semiconductor dies 128c are mounted in the next coolest die attach locations available on the DIMM substrate 102.

In some embodiments, the third semiconductor dies 128c can have one or more operating parameters that are less affected by temperature than the first semiconductor dies 128a, but more affected than the second semiconductor dies 128b. Accordingly, in these embodiments, the placement of the third semiconductor dies 128c in the next third die attach locations 130c can improve the overall functionality of the DIMM 100 by at least partially avoiding the deleterious effects of the higher temperatures. In some embodiments, the third semiconductor dies 128c can be the second most temperature-affected. Accordingly, in these embodiments, the placement of the third semiconductor dies 128c in the third die attach locations 130c further improve the overall functionality of the DIMM 100 by further avoiding the deleterious effects of the higher temperatures.

Figure 6A:
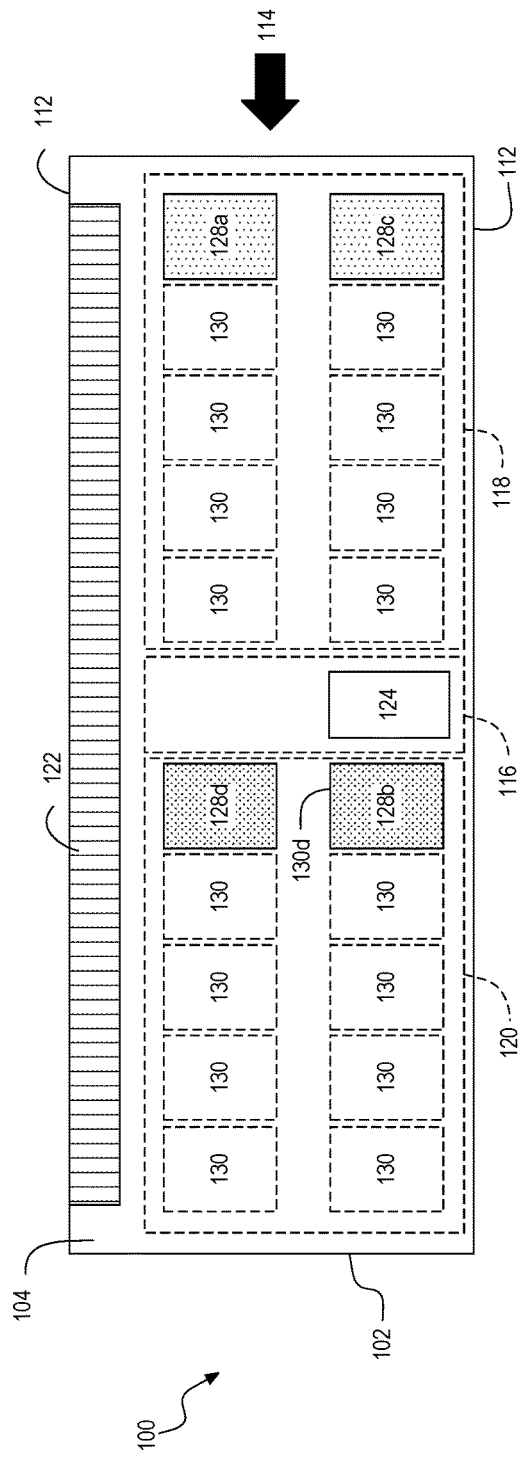
FIG. 6A is a top plan view of the DIMM of FIG. 5A after two fourth semiconductor dies are mounted to the substrate in accordance with some embodiments of the present technology.
Figure 6B:
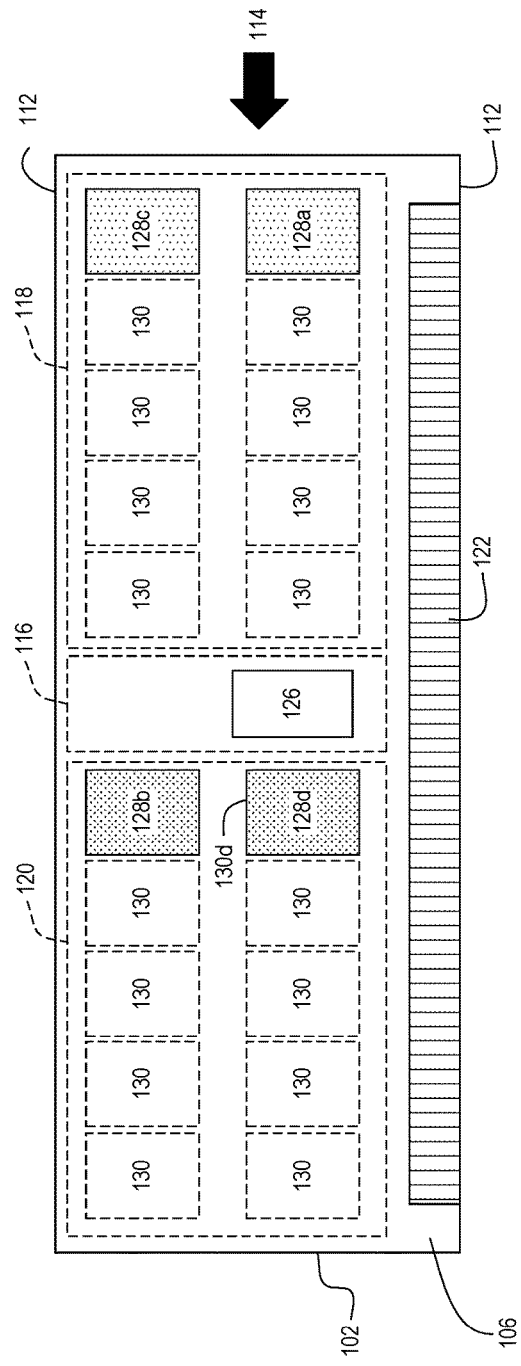
FIG. 6B is a bottom plan view of the DIMM of FIG. 5A after two fourth semiconductor dies are mounted to the substrate in accordance with some embodiments of the present technology.

FIG. 6A is a top plan view, and FIG. 6B is a bottom plan view, illustrating the DIMM 100 after two fourth semiconductor dies 128d are mounted to the DIMM substrate 102 in accordance with some embodiments of the present technology. In the illustrated embodiment, the fourth semiconductor dies 128d have been mounted to the DIMM substrate 102 in two fourth die attach locations 130d that are next proximal-most to the PMIC 124 in the second array area 120 after the second semiconductor dies 128b have been mounted. Accordingly, in some embodiments, the fourth semiconductor dies 128d are mounted in the next hottest die attach locations available on the DIMM substrate 102.

In some embodiments, the fourth semiconductor dies 128d can have one or more operating parameters that are less affected by temperature than the third semiconductor dies 128c, but more affected than the second semiconductor dies 128b. Accordingly, in these embodiments, the placement of the fourth semiconductor dies 128d in the fourth die attach locations 130d can improve the overall functionality of the DIMM 100 by partially reducing the deleterious effects of the higher temperatures (e.g., by locating less temperature-affected semiconductor dies in hotter die attach locations). In some embodiments, the fourth semiconductor dies 128d can be the second least temperature-affected dies. Accordingly, in these embodiments, the placement of the fourth semiconductor dies 128d in the fourth die attach locations 130d can further improve the overall functionality of the DIMM 100 by further reducing the deleterious effects of the higher temperatures.

Figure 7A:
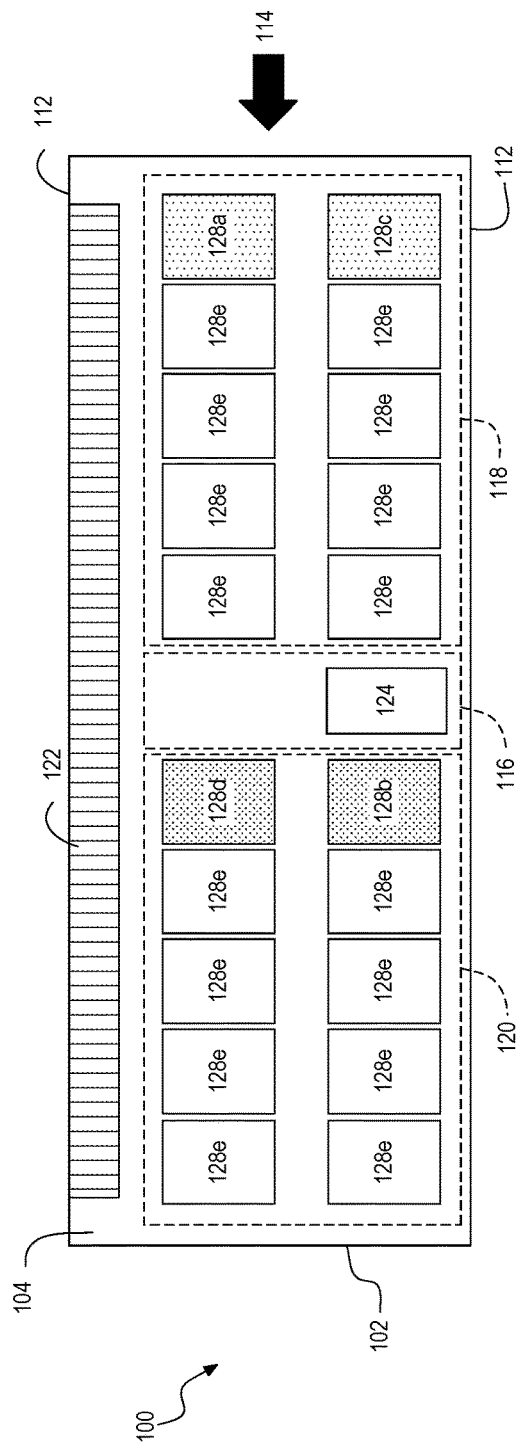
FIG. 7A is a top plan view of the DIMM of FIG. 6A after the remaining semiconductor dies are mounted to the substrate in accordance with some embodiments of the present technology.
Figure 7B:
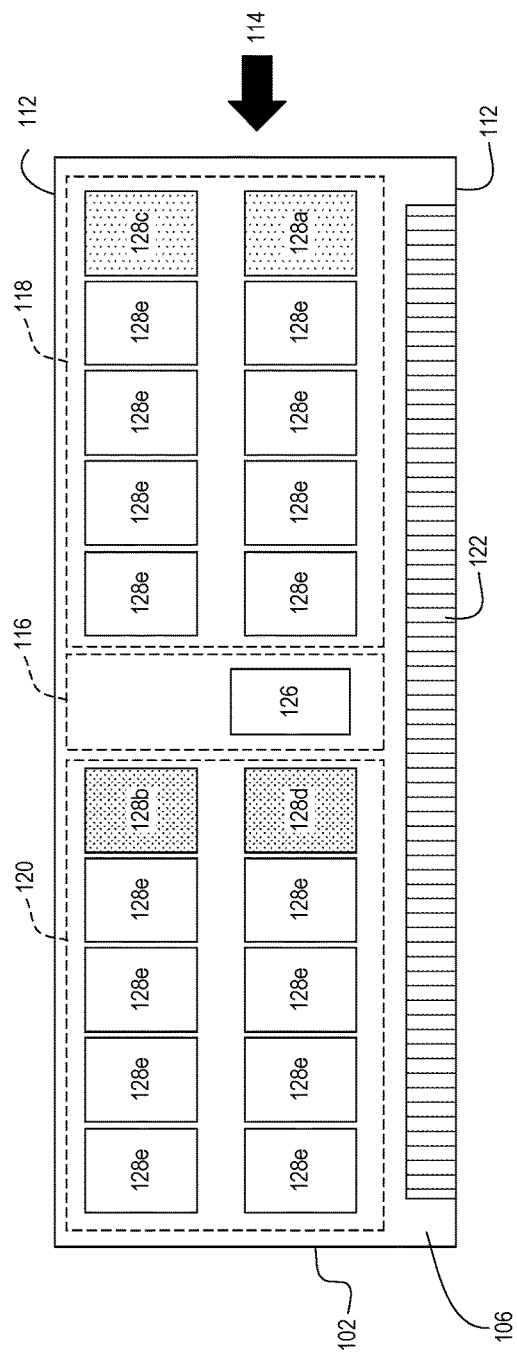
FIG. 7B is a bottom plan view of the DIMM of FIG. 6A after the remaining semiconductor dies are mounted to the substrate in accordance with some embodiments of the present technology.

FIG. 7A is a top plan view, and FIG. 7B is a bottom plan view, illustrating the DIMM 100 after any remaining semiconductor dies 128e are mounted to the DIMM substrate 102 in accordance with some embodiments of the present technology. In the illustrated embodiment, the remaining semiconductor dies 128e have been mounted to the DIMM substrate 102 in the remaining die attach locations without regard for the effect higher temperatures have on their operating parameters. That is, in the illustrated embodiment, the method described above stops selectively mounting semiconductor dies after the fourth semiconductor dies are mounted. For example, in some embodiments, continued selective placement can result in minimal further improvements to the overall performance of the DIMM 100. In some embodiments, for example, the remaining semiconductor dies 128e can have an operating parameter at higher temperatures that generally does not vary (or varies insignificantly) between the remaining semiconductor dies 128e. In some embodiments, the remaining die attach locations can have relatively small differences in operating temperatures.

In some embodiments, the semiconductor dies 128 can be mounted in various other arrangements or orders. For example, the second semiconductor dies 128b can be mounted first, all of the less temperature-affected semiconductor dies can be mounted first, the semiconductor dies 128 can be mounted from left to right while selectively placing the first, second, third and/or fourth semiconductor dies 128a-d. In various embodiments, the selective placement method can stop at various other points after selectively mounting any number of semiconductor dies. For example, in some in some embodiments, the method can stop after only the first semiconductor dies 128a have been selectively mounted. In some embodiments, the method can stop after only the second semiconductor dies 128b have been selectively mounted. In some embodiments, the method can stop after the first and second semiconductor dies 128a, 128b have been selectively mounted. In some embodiments, the method can continue to selectively place semiconductor dies 128 in die attach locations until every semiconductor die 128 has been mounted to the DIMM substrate 102.

Figure 8:
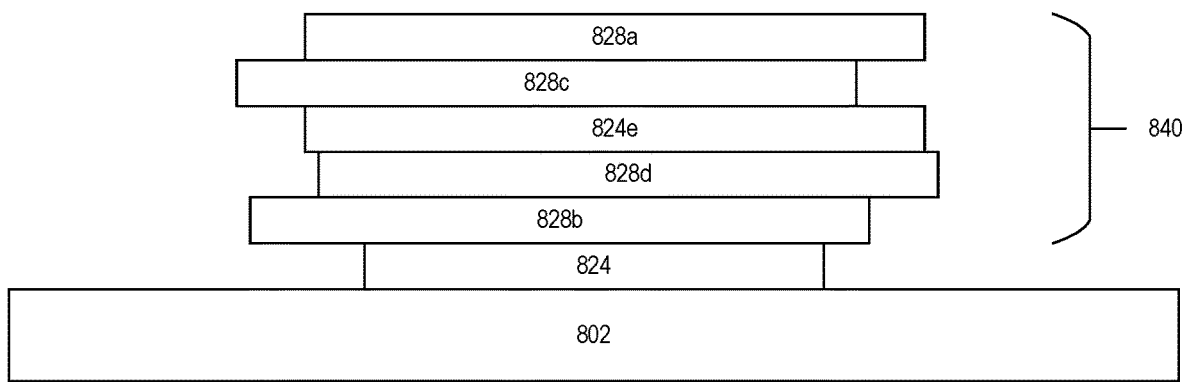
FIG. 8 is a cross-sectional view of a semiconductor die assembly configured in accordance with an embodiment of the present technology.

As disclosed above, the method of selectively placing semiconductor dies to passively mitigate and/or maximize temperature affects can be applied to various other semiconductor devices to improve their performance (e.g., any generation DIMM having any rank of semiconductor dies, other memory modules, semiconductor die stacks, and other semiconductor devices). For example, FIG. 8 is a cross-sectional view of a semiconductor die assembly 800 ("assembly 800") configured in accordance with an embodiment of the present technology. In the illustrated embodiment, the assembly 800 includes a package support substrate 802 (e.g., an interposer), a controller die 824 mounted to the support substrate 802, and several semiconductor dies 828 (labelled individually as 828*a-e*) mounted to the controller die 824 in a stack of semiconductor dies 840 (the "stack 840").

In the illustrated embodiment, the controller die 824 can be a significant source of heat in the assembly 800. As a result, the operating temperature of the assembly 800 can be hotter near the controller die 824 and cooler far away such that the operating temperature of semiconductor dies 828 in the stack 840 gradually decreases as semiconductor dies 828 are added. In the illustrated embodiment, for example, a first semiconductor die 828*a* is the top semiconductor die in the stack 840 farthest away from the controller die 824. Accordingly, the performance of the assembly 800 can be improved when the first semiconductor die 828*a* is more temperature-affected than other semiconductor dies 828 in the stack 840. In some embodiments, the first semiconductor die 828*a* can be the most temperature-affected of all of the semiconductor dies 828, further improving the performance of the assembly 800.

Further, a second semiconductor die 828*b* is the lowest semiconductor die in the stack 840 (e.g., the second semiconductor die 828*b* is mounted on the controller die 824). Accordingly, the performance of the assembly 800 can be improved when the second semiconductor die 828*b* is less temperature-affected than other semiconductor dies 828 in the stack 840. In some embodiments, the second semiconductor die 828*b* can be the least temperature-affected of all of the semiconductor dies 828, further improving the performance of the assembly 800.

As further illustrated, a third semiconductor die 828*c* is underneath the first semiconductor die 828*a*, second to top in the stack 840 (e.g., in the second coolest location in the stack 840). Accordingly, the performance of the assembly 800 can be improved when the third semiconductor die 828*c* is more temperature-affected than other semiconductor dies 828 in the stack 840. In some embodiments, the third semiconductor die 828*c* can be the second most temperature-affected of all of the semiconductor dies 828. A fourth semiconductor die 828*d* is above the second semiconductor die 828*b*, second to bottom in the stack 840 (e.g., in the second hottest location in the stack 840). Accordingly, the performance of the assembly 800 can be improved when the fourth semiconductor die 828*d* is less temperature-affected than other semiconductor dies 828 in the stack 840. In some embodiments, the fourth semiconductor die 828*d* can be the second least temperature-affected of all of the semiconductor dies 828. Finally, in the illustrated embodiment, a fifth semiconductor die 828*e* is in the middle of the stack 840 (e.g., in the median temperature location). The fifth semiconductor die 828*e* can be affected by temperature more than the second and/or fourth semiconductor dies 128*b*, 128*d*, but less than the first and/or third semiconductor dies 128*a*, 128*c*.

In some embodiments, the fifth semiconductor die can be used as a dividing die in the stack 840, with more temperature-affected semiconductor dies placed above the fifth semiconductor die 828*e* (but in no particular order), and less temperature-affected dies placed below the fifth semiconductor die 828*e* (but in no particular order).

By selectively placing the semiconductor dies 828 in the stack 840, the method can result in an improved performance of the assembly 800. For example, in some embodiments, the semiconductor dies 128 can be placed based on the effect of temperature on power consumption in the assembly. In these embodiments, the selective placement can reduce the amount of power that leaks out of the assembly 800 during operation without introducing other components to the assembly 800.

Figure 9:
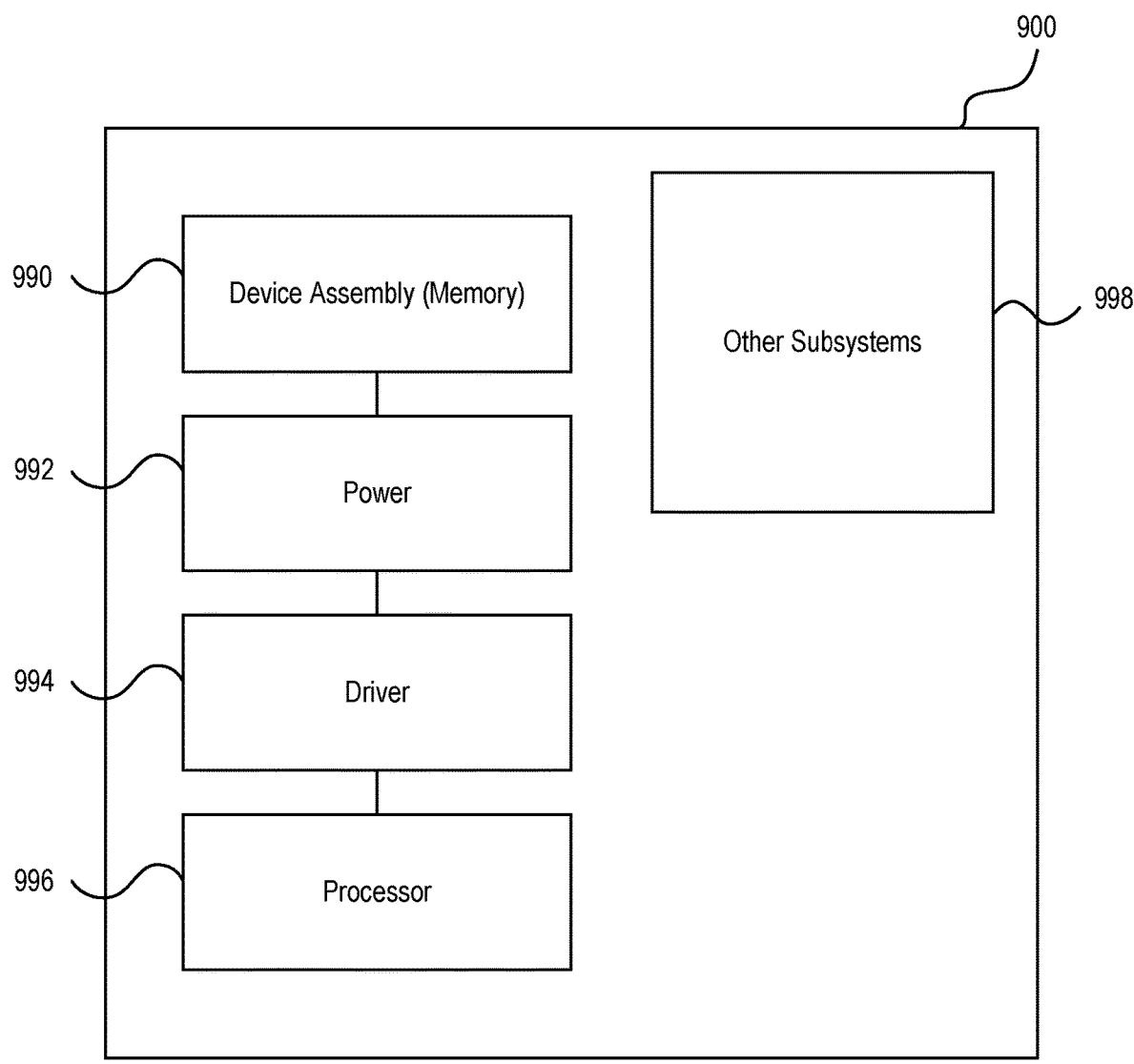
FIG. 9 is a schematic view of a system that includes a semiconductor die assembly configured in accordance with embodiments of the present technology.

Any one of the semiconductor devices having the features described above with reference to FIGS. 1A-8 can be incorporated into any of a myriad of larger and/or more complex systems, a representative example of which is system 900 shown schematically in FIG. 9. The system 900 can include a memory 990 substantially as described above (e.g., SRAM, DRAM, flash, and/or other memory devices), a power supply 992, a drive 994, a processor 996, and/or other subsystems or components 998. The semiconductor devices described above with reference to FIGS. 1A-9 can be included in any of the elements shown in FIG. 9. For example, the memory 990 can be a DDR5 DIMM configured in the embodiment shown in FIGS. 7A and 7B. The resulting system 900 can be configured to perform any of a wide variety of suitable computing, processing, storage, sensing, imaging, and/or other functions. Accordingly, representative examples of the system 900 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 900 include lights, cameras, vehicles, etc. With regard to these and other example, the system 900 can be housed in a single unit or distributed over multiple interconnected units, e.g., through a communication network. The components of the system 900 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Furthermore, certain aspects of the present technology described in the context of particular embodiments may also be combined or eliminated in other embodiments. For example, the various embodiments described with reference to FIGS. 1A-7B may be altered to incorporate different numbers of first, second, third and/or fourth semiconductor dies (e.g., three first dies, five first dies, six first dies, four first dies, etc.) that are accordingly mounted in die attach locations. Further, the selective placement method described above with respect to FIGS. 1A-8 can be applied to other semiconductor devices, such as various other generations of DIMMs and/or or other memory modules. Accordingly, the invention is not limited except as by the appended claims. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A method for constructing a memory module, comprising:

for each individual semiconductor die in a plurality of semiconductor dies for the memory module, determining a susceptibility to temperature of an operating parameter of the individual semiconductor die based on a change in a measurement of the operating parameter between a first temperature and a second temperature;
identifying one or more semiconductor dies that are least temperature-affected based on the determined susceptibility to temperature for each of the plurality of semiconductor dies; and
mounting the one or more semiconductor dies that are least temperature-affected at a first array area of a memory module substrate, wherein the first array area is hotter than a second array area during operation.

2. The method of claim 1, further comprising:
identifying a hottest die location in the first array area, the hottest die location having a highest temperature in the first array area during operation; and
placing one of the one or more semiconductor dies that are least temperature-affected in the hottest die location in the first array area.

3. The method of claim 1, further comprising:
identifying one or more semiconductor dies that are most temperature-affected based on the determined susceptibility to temperature for each of the plurality of semiconductor dies; and
mounting the one or more semiconductor dies that are most temperature-affected at the second array area of a memory module substrate, wherein the second array area is a coldest array area during operation.

4. The method of claim 3 further comprising:
identifying a coolest die location in the second array area, the coolest die location having a lowest temperature in the second array area during operation; and
placing one of the one of the one or more semiconductor dies that are most temperature-affected in the coolest die location in the second array area.

5. The method of claim 1 wherein the operating parameter includes a measurement of power consumption and/or data retention.

6. The method of claim 1 wherein the one or more semiconductor dies that are least temperature-affected are a first set of semiconductor dies, further comprising:
identifying a second set of semiconductor dies, each die in the second set of semiconductor dies more temperature-affected than the first set of semiconductor dies semiconductor die and less temperature-affected than other dies based on the determined susceptibility to temperature for each of the plurality of semiconductor dies; and
mounting the second set of semiconductor dies at a third array area of the memory module substrate, wherein the third array area is cooler than the first array area during operation and warmer than the second array area during operation.

7. A memory module comprising:
a substrate that includes a surface having a central portion, a first array area upstream from the central portion with respect to an airflow across the surface during operation and a second array area downstream from the central portion with respect to the airflow across the surface during operation;
a first semiconductor die mounted to the surface in the first array area, wherein the first semiconductor die has a first performance rating of an operating parameter affected by temperature, wherein the first semiconductor die has a first degree of susceptibility to temperature based on a change in an operating parameter at different temperatures; and
a second semiconductor die mounted to the surface in the second array area, wherein the second semiconductor die has a second degree of susceptibility to temperature based on a change in the operating parameter at different temperatures, wherein the second degree is smaller than the first degree such that the second semiconductor die operates more effectively than the first semiconductor die at a temperature of the second array area during operation, and wherein the first and second semiconductor dies are the same type of dies.

8. The memory module of claim 7 wherein: the first semiconductor die is mounted in the first array area on the surface of the substrate in a distal-most location relative to the central portion.

9. The memory module of claim 7 wherein the second semiconductor die is mounted to the second array area on the surface of the substrate in a proximal-most position to the central portion.

10. The memory module of claim 7 further comprising a power management integrated circuit mounted to the central portion of the surface.

11. The memory module of claim 7 wherein:
the surface is a first surface;
the substrate includes a second surface opposite the first surface having a central portion and a third array area upstream from the central portion with respect to an airflow across the second surface during operation; and
the memory module further comprises a third semiconductor die attached to the substrate in the third array area on the second surface, wherein the third semiconductor die has a third degree of susceptibility to temperature is based on a change in the operating parameter at different temperatures, and wherein the third degree is greater than the first degree.

12. The memory module of claim 7 wherein:
the surface is a first surface;
the substrate includes a second surface opposite the first surface having a central portion and a third array area downstream from the central portion with respect to an airflow across the second surface during operation; and
the memory module further comprises a third semiconductor die attached to the substrate in the first array area on the second surface, wherein the third semiconductor die has a third degree of susceptibility to temperature is based on a change in the operating parameter at different temperatures, and wherein the third degree is less than the first degree and greater than the second degree.

13. The memory module of claim 7 wherein the operating parameter includes a measurement of power consumption and/or data retention.

14. The memory module of claim 7 wherein the second semiconductor die is a least temperature-affected semiconductor die in the memory module such that it has a lowest degree of susceptibility to temperature of any semiconductor die attached to the substrate.

15. A memory module comprising:
a substrate that includes a central portion, a first array area downstream from the central portion with respect to an airflow across the substrate, a second array area upstream from the central portion with respect to the airflow across the substrate, wherein an upper surface of the substrate includes one or more die attach locations in each of the first and second array areas; and
a plurality of semiconductor dies attached to die attach locations in the first and second arrays, wherein the plurality of semiconductor dies include a first semiconductor die attached to the upper surface of the substrate in a first die attach location in the first array area closest to the central portion, wherein the first semiconductor die has a first variance in an operating parameter between different temperatures and that is less than a variance of each other semiconductor die in the plurality of semiconductor dies.

16. The memory module of claim 15 wherein the plurality of semiconductor dies further include a second semiconductor die attached to the upper surface of the substrate in a second die attach location in the second array area, wherein the second semiconductor die has a second variance in the operating parameter between different temperatures and that is greater than the variance of any semiconductor die attached to the upper surface in the first array area.

17. The memory module of claim 16:
the second die attach location is a die attach location on the upper surface furthest from the central portion of the substrate; and
the plurality of semiconductor dies further include a third semiconductor die attached to the upper surface of the substrate in a third die attach location in the second array area closer to the central portion than the second die attach location, wherein the third semiconductor die has a third variance in the operating parameter between different temperatures and that is less than the second variance.

18. The memory module of claim 15 wherein a lower surface of the substrate includes one or more die attach locations in each of the first and second array areas, wherein the plurality of semiconductor dies further include a second semiconductor die attached to the lower surface of the substrate in a second die attach location furthest from the central portion in the second array area, wherein the second semiconductor die has a second variance in the operating parameter between different temperatures and that is greater than the variance of each other in the plurality of semiconductor dies.

19. The memory module of claim 15 wherein the operating parameter includes a measurement of power consumption and/or data retention.

20. The memory module of claim 15, further comprising one or more heat generating elements attached to the central portion of the upper surface.

* * * * *